(12) United States Patent
Liu et al.

(10) Patent No.: US 10,074,628 B2
(45) Date of Patent: Sep. 11, 2018

(54) SYSTEM-IN-PACKAGE AND FABRICATION METHOD THEREOF

(71) Applicant: MEDIATEK INC., Hsin-Chu (TW)

(72) Inventors: Hsing-Chih Liu, Taichung (TW); Che-Ya Chou, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/182,613

(22) Filed: Jun. 15, 2016

(65) Prior Publication Data

US 2016/0293575 A1 Oct. 6, 2016

Related U.S. Application Data

(63) Continuation-in-part of application No. 14/850,962, filed on Sep. 11, 2015, now abandoned, which is a
(Continued)

(51) Int. Cl.
*H01L 23/495* (2006.01)
*H01L 25/065* (2006.01)
(Continued)

(52) U.S. Cl.
CPC .......... *H01L 25/0652* (2013.01); *H01L 21/78* (2013.01); *H01L 23/3135* (2013.01);
(Continued)

(58) Field of Classification Search
CPC . H01L 51/5012; H01L 33/62; H01L 51/0072; H01L 51/56; H01L 51/5016
(Continued)

(56) References Cited

U.S. PATENT DOCUMENTS 6,759,753 B2 * 7/2004 Chao ...................... H01L 23/15
257/666
8,084,853 B2 12/2011 Hsieh
(Continued)

FOREIGN PATENT DOCUMENTS

CN 101814474 A 8/2010
CN 102034777 A 4/2011
(Continued)

OTHER PUBLICATIONS

U.S. Appl. No. 15/588,690, filed May 7, 2017, Chou et al.
(Continued)

*Primary Examiner* — Andy Huynh
(74) *Attorney, Agent, or Firm* — Wolf, Greenfield & Sacks, P.C.

(57) ABSTRACT

A system-in-package (SiP) includes a RDL structure having a first side and a second side opposite to the first side; a first semiconductor die mounted on the first side of the RDL structure, wherein the first semiconductor die has an active surface that is in direct contact with the RDL structure; a plurality of conductive fingers on the first side of the RDL structure around the first semiconductor die; a second semiconductor die stacked directly on the first semiconductor die, wherein the second semiconductor die is electrically connected to the plurality of conductive fingers through a plurality of bond wires; and a mold cap encapsulating the first semiconductor die, the conductive fingers, the second semiconductor die, and the first side of the RDL structure.

12 Claims, 13 Drawing Sheets

Related U.S. Application Data continuation of application No. 14/045,803, filed on Oct. 4, 2013, now Pat. No. 9,165,877.

(60) Provisional application No. 62/241,248, filed on Oct. 14, 2015.

(51) Int. Cl.

| | | |
|---|---|---|
| *H01L 21/78* | (2006.01) | |
| *H01L 25/00* | (2006.01) | |
| *H01L 25/16* | (2006.01) | |
| *H01L 23/31* | (2006.01) | |
| *H01L 23/498* | (2006.01) | |
| *H01L 23/00* | (2006.01) | |
| *H01L 25/03* | (2006.01) | |
| *H01L 25/18* | (2006.01) | |
| *H01L 21/56* | (2006.01) | |

(52) U.S. Cl.
CPC .. *H01L 23/49811* (2013.01); *H01L 23/49816* (2013.01); *H01L 23/49827* (2013.01); *H01L 23/49833* (2013.01); *H01L 24/19* (2013.01); *H01L 24/20* (2013.01); *H01L 24/96* (2013.01); *H01L 24/97* (2013.01); *H01L 25/03* (2013.01); *H01L 25/0657* (2013.01); *H01L 25/16* (2013.01); *H01L 25/18* (2013.01); *H01L 25/50* (2013.01); *H01L 21/561* (2013.01); *H01L 21/568* (2013.01); *H01L 23/49822* (2013.01); *H01L 25/0655* (2013.01); *H01L 2223/6677* (2013.01); *H01L 2224/04042* (2013.01); *H01L 2224/04105* (2013.01); *H01L 2224/12105* (2013.01); *H01L 2224/16227* (2013.01); *H01L 2224/32145* (2013.01); *H01L 2224/32225* (2013.01); *H01L 2224/48137* (2013.01); *H01L 2224/48227* (2013.01); *H01L 2224/73204* (2013.01); *H01L 2224/73265* (2013.01); *H01L 2224/73267* (2013.01); *H01L 2224/83005* (2013.01); *H01L 2224/85005* (2013.01); *H01L 2224/92244* (2013.01); *H01L 2224/92247* (2013.01); *H01L 2225/0651* (2013.01); *H01L 2225/06568* (2013.01); *H01L 2924/00014* (2013.01); *H01L 2924/01322* (2013.01); *H01L 2924/12042* (2013.01); *H01L 2924/141* (2013.01); *H01L 2924/142* (2013.01); *H01L 2924/1421* (2013.01); *H01L 2924/15192* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01)

(58) Field of Classification Search
USPC .......................................... 257/668
See application file for complete search history.

(56) References Cited

U.S. PATENT DOCUMENTS

| | | |
|---|---|---|
| 8,310,051 B2 | 11/2012 | Chen |
| 8,900,931 B2 | 12/2014 | Liang |
| 2003/0111716 A1* | 6/2003 | Ano ............... H01L 24/48 257/678 |
| 2004/0184250 A1 | 9/2004 | Wang |
| 2004/0195591 A1 | 10/2004 | Gehman et al. |
| 2005/0194674 A1* | 9/2005 | Thomas ............ H01L 25/0657 257/690 |
| 2008/0261039 A1 | 10/2008 | Tanaka |
| 2008/0296050 A1* | 12/2008 | Uda ................ H01L 23/66 174/255 |
| 2010/0072602 A1 | 3/2010 | Sutardja |
| 2010/0213588 A1 | 8/2010 | Hsieh |
| 2010/0213589 A1 | 8/2010 | Hsieh |
| 2011/0006417 A1 | 1/2011 | Sugihara |
| 2011/0074008 A1 | 3/2011 | Hsieh |
| 2012/0032314 A1 | 2/2012 | Chen |
| 2012/0032322 A1 | 2/2012 | Lin |
| 2014/0054760 A1 | 2/2014 | Yu |
| 2015/0140736 A1* | 5/2015 | Pendse ............. H01L 24/19 438/109 |
| 2016/0005726 A1 | 1/2016 | Chen et al. |

FOREIGN PATENT DOCUMENTS

| | | |
|---|---|---|
| CN | 103199075 | 7/2013 |
| JP | 201073893 A | 4/2010 |

OTHER PUBLICATIONS

EP 17174129.1, Nov. 14, 2017, Extended European Search Report.
Extended European Search Report for Application No. EP 17174129.1 dated Nov. 14, 2017.

* cited by examiner

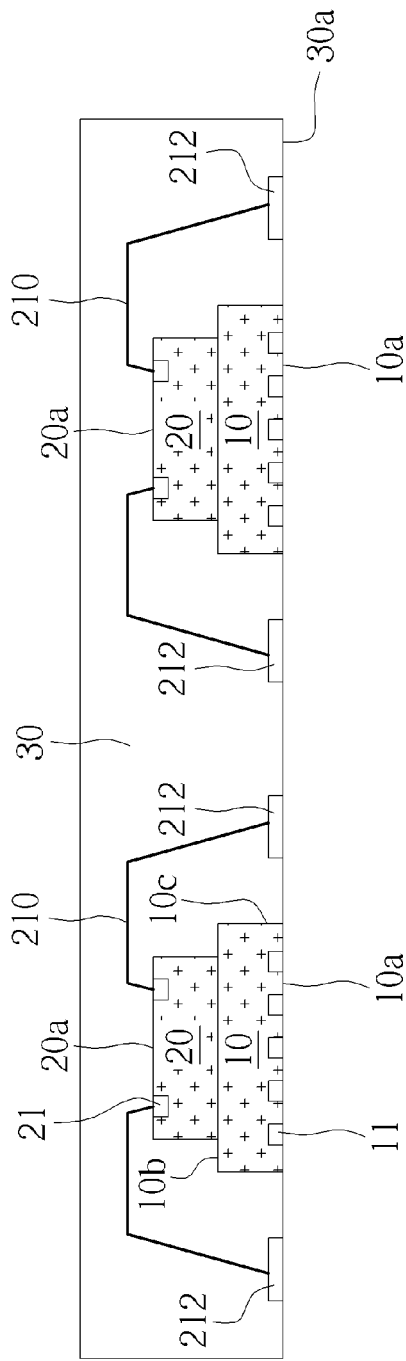
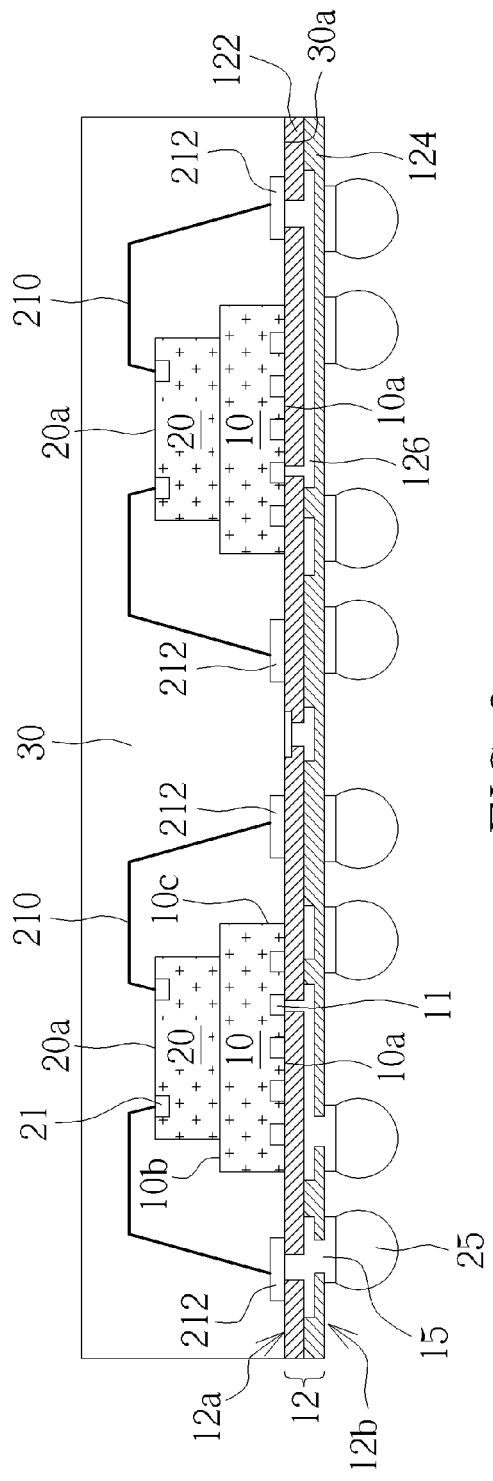

SYSTEM-IN-PACKAGE AND FABRICATION METHOD THEREOF

CROSS REFERENCE TO RELATED APPLICATION

This application is a continuation-in-part of U.S. application Ser. No. 14/850,962 filed Sep. 11, 2015, which itself is a continuation application of U.S. patent application Ser. No. 14/045,803 filed Oct. 4, 2013, now U.S. Pat. No. 9,165,877B2. This application also claims priority from U.S. provisional application No. 62/241,248 filed Oct. 14, 2015. All of the above-mentioned applications are included herein in their entirety by reference.

BACKGROUND

The present invention relates generally to semiconductor packaging and, more particularly, to a hybrid system-in-package (SiP) with flip-chip and wire-bonded chip on a fan-out redistribution layer (RDL) carrier. An exemplary method for fabricating such hybrid system-in-package is also disclosed.

As known in the art, there are a variety of chip package techniques such as ball grid array (BGA), wire bonding, flip-chip, etc. for mounting a die on a substrate via the bonding points on both the die and the substrate. In order to ensure miniaturization and multi-functionality of electronic products or communication devices, semiconductor packages are required to be of small in size, multi-pin connection, high speed, and high functionality.

Wire-bonding System-in-Package (wBSiP) technology is widely used because it can increase the capacity of the semiconductor package. wBSiP includes a plurality of chips, which are stacked and may be connected to each other by way of wire bonding. However, the conventional wBSiP encounters several problems, for example, the thickness of the package, ability to support fine pitch pad, and low-resistance/inductance IP.

Increased Input-Output (I/O) pin count combined with increased demands for high performance ICs has led to the development of Flip-Chip Packages. Flip-chip technique uses bumps on bonding pads on chip to interconnect directly to the package medium. The chip is bonded face down to the package medium through the shortest path. The technique can be applied not only to single-chip packaging, but also to higher or integrated levels of packaging in which the packages are larger and to more sophisticated substrates that accommodate several chips to form larger functional units. The flip-chip technique, using an area array, has the advantage of achieving the highest density of interconnection to the device and a very low inductance interconnection to the package.

FIG. 1 is a schematic, cross-sectional diagram illustrating a conventional flip-chip chip scale package (FCCSP). As shown in FIG. 1, the FCCSP 100 comprises a die 101 mounted face-down on a top surface of the carrier 120 and is connected to the carrier 120 through solder bumps 102. A plurality of solder balls 122 are provided on a bottom surface of the carrier 120 for the connection with a circuit board. This package construction typically utilizes eutectic tin/lead flip-chip interconnect technique, in either area array or peripheral bump layout, replacing standard wire-bond interconnect. The elimination of wire-bond loops allows for a low inductance connection to the die, while the increased routing density enables optimized electrical paths for critical high frequency signal lines.

FIG. 2 is a schematic, cross-sectional diagram illustrating a conventional flip-chip ball grid array (FCBGA) package. As shown in FIG. 2, the FCBGA package 200 comprises a die 201 mounted face-down on a top surface of a chip carrier substrate 220 and is connected to the chip carrier substrate 220 through the solder bumps 202. An underfill 203 fills the gap between the die 201 and the top surface of the chip carrier substrate 220. The chip carrier substrate 220 may comprise multi-layer traces, and different layers of traces are interconnected together through blind via 222 or buried via 224. For example, the blind via 222 may be drilled by laser for achieving a higher density. A plurality of solder balls 226 are provided on a bottom surface of the chip carrier substrate 220. The FCBGA package 200 allows for the design of advanced packaging solutions that are ideal for current and future high-speed networking and digital TV systems. For example, to maintain signal integrity, this package features low inductance, low dielectric loss and impedance matching.

However, the conventional flip-chip technique is facing the challenge of bump pitch limitation on the substrate. Besides, a high-performance FCBGA package is costly due to the expensive chip carrier substrate that typically comprises 1+2+1 or more-layer build up. The bottleneck of the flip-chip roadmap is the bump pitch of the substrate since the development and shrinkage of the bump pitch is much slower than the die shrinking and the increase of the pin count. Even the die shrinking will exceed the shrinkage of bump pitch resolution on substrate carrier in the future. To conquer the issue of such technology gap, silicon interposer and TSV (Through Silicon Via) technology, and fine pitch bump technology are preferred solutions. However, the above-mentioned technologies are very expensive and involve complex fabrication processes.

Therefore, there is a strong need in this industry to provide an improved flip-chip package or a system-in-package (SiP) that has improved routing flexibility with fine pitch, and is cost-effective, and can overcome the bump pitch limitation on the substrate. Further, it is desirable to provide a semiconductor package with improved routing flexibility on the package substrate.

SUMMARY

It is one object of the present invention to provide a hybrid system-in-package (SiP) with fan-out flip-chip and wire-bonded chip on a redistribution layer (RDL) carrier in order to solve the above-mentioned prior art problems and shortcomings.

It is another object of the present invention to provide a method for fabricating a hybrid system-in-package (SiP) without utilizing an expensive package substrate or chip carrier substrate.

According to one embodiment, a hybrid system-in-package (SiP) includes a RDL structure having a first side and a second side opposite to the first side; a first semiconductor die mounted on the first side of the RDL structure, wherein the first semiconductor die has an active surface that is in direct contact with the RDL structure; a plurality of conductive fingers on the first side of the RDL structure around the first semiconductor die; a second semiconductor die stacked directly on the first semiconductor die, wherein the second semiconductor die is electrically connected to the plurality of conductive fingers through a plurality of bond wires; and a mold cap encapsulating the first semiconductor die, the conductive fingers, the second semiconductor die, and the first side of the RDL structure.

According to another embodiment, a hybrid system-in-package (SiP) includes a RDL structure having a first side and a second side opposite to the first side; a first semiconductor die mounted on the first side of the RDL structure, wherein the first semiconductor die has an active surface that is indirect contact with the RDL structure; a second semiconductor die mounted on the first side of the RDL structure in close proximity to the first semiconductor die; a plurality of conductive fingers on the first side of the RDL structure around the first semiconductor die; a plurality of bond wires electrically connecting the second semiconductor die to the plurality of conductive fingers; and a mold cap encapsulating the first semiconductor die, the conductive fingers, the second semiconductor die, and the first side of the RDL structure.

According to still another embodiment, a system-in-package (SiP) includes a first dielectric layer; a first semiconductor die mounted on the first dielectric layer; a plurality of conductive fingers on the first side of the RDL structure around the first semiconductor die; a plurality of circuit features on the first dielectric layer, wherein at least some of the circuit features are disposed directly under the first semiconductor die; a second semiconductor die stacked directly on the first semiconductor die; a plurality of bond wires extending between the first semiconductor die and the some of the conductive fingers and between the second semiconductor die and some of the conductive fingers; and a mold cap encapsulating the first semiconductor die, the conductive fingers, the second semiconductor die, and covering a surface of the first dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 4 to FIG. 10 are schematic, cross-sectional diagrams showing an exemplary method for fabricating a hybrid SiP as set forth in FIG. 3 according to one embodiment of the invention;

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "wafer" and "substrate" used herein include any structure having an exposed surface onto which a layer is deposited according to the present invention, for example, to form the integrated circuit (IC) structure. The term "substrate" is understood to include semiconductor wafers. The term "substrate" is also used to refer to semiconductor structures during processing, and may include other layers that have been fabricated thereupon. The terms "die", "chip", "semiconductor chip", and "semiconductor die" are used interchangeably throughout the specification.

The following detailed description is, therefore, not to be taken in a limiting sense, and the scope of the present invention is defined only by the appended claims, along with the full scope of equivalents to which such claims are entitled.

Figure 1:
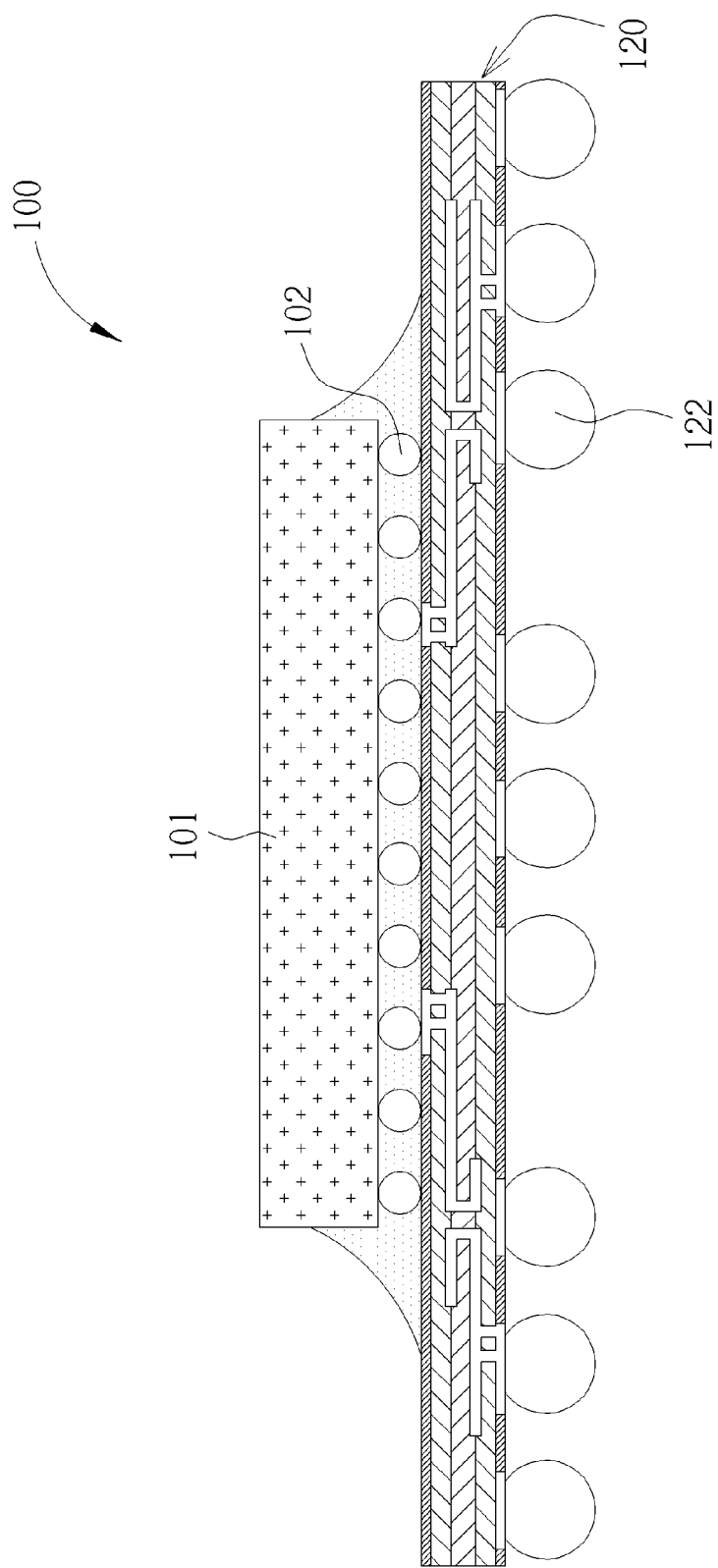
FIG. 1 is a schematic, cross-sectional diagram illustrating a conventional flip-chip CSP package.
Figure 2:
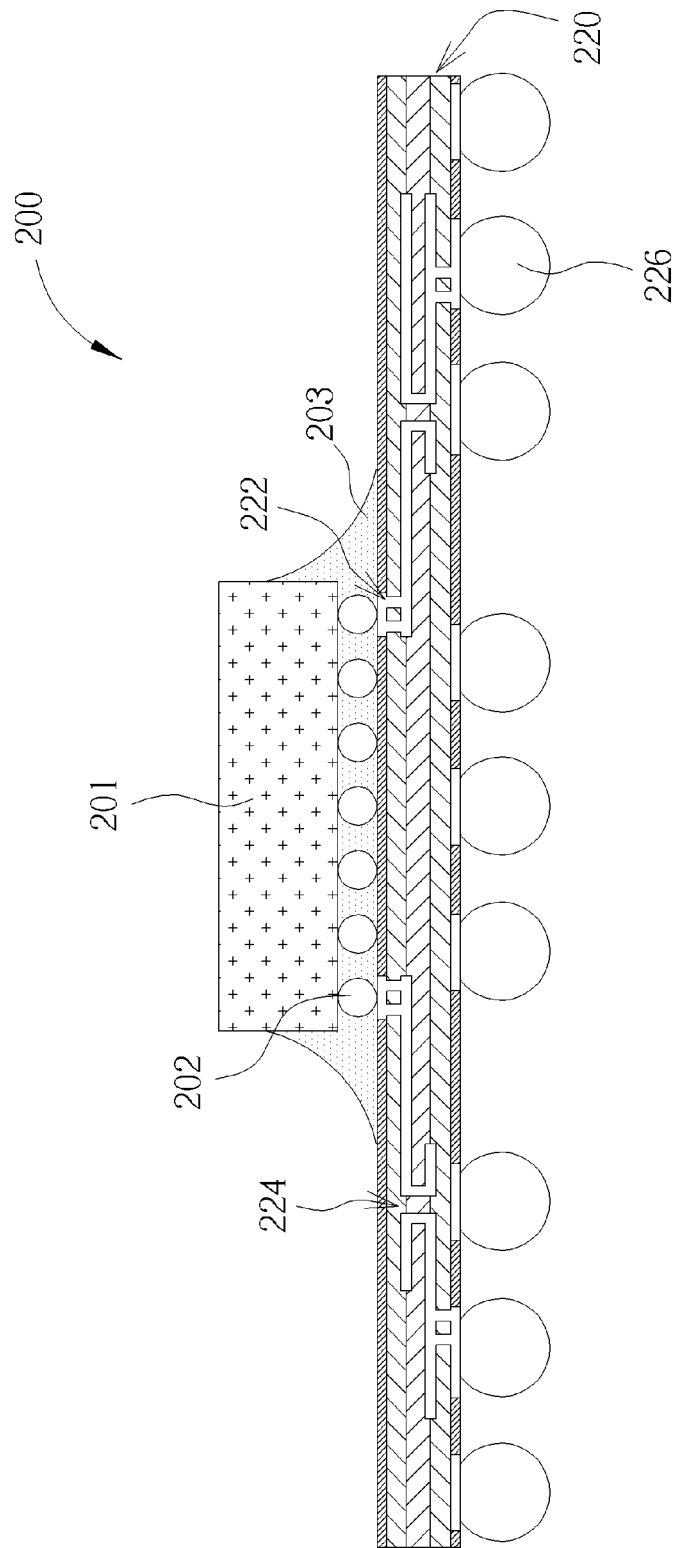
FIG. 2 is a schematic, cross-sectional diagram illustrating a conventional flip-chip BGA package.
Figure 3:
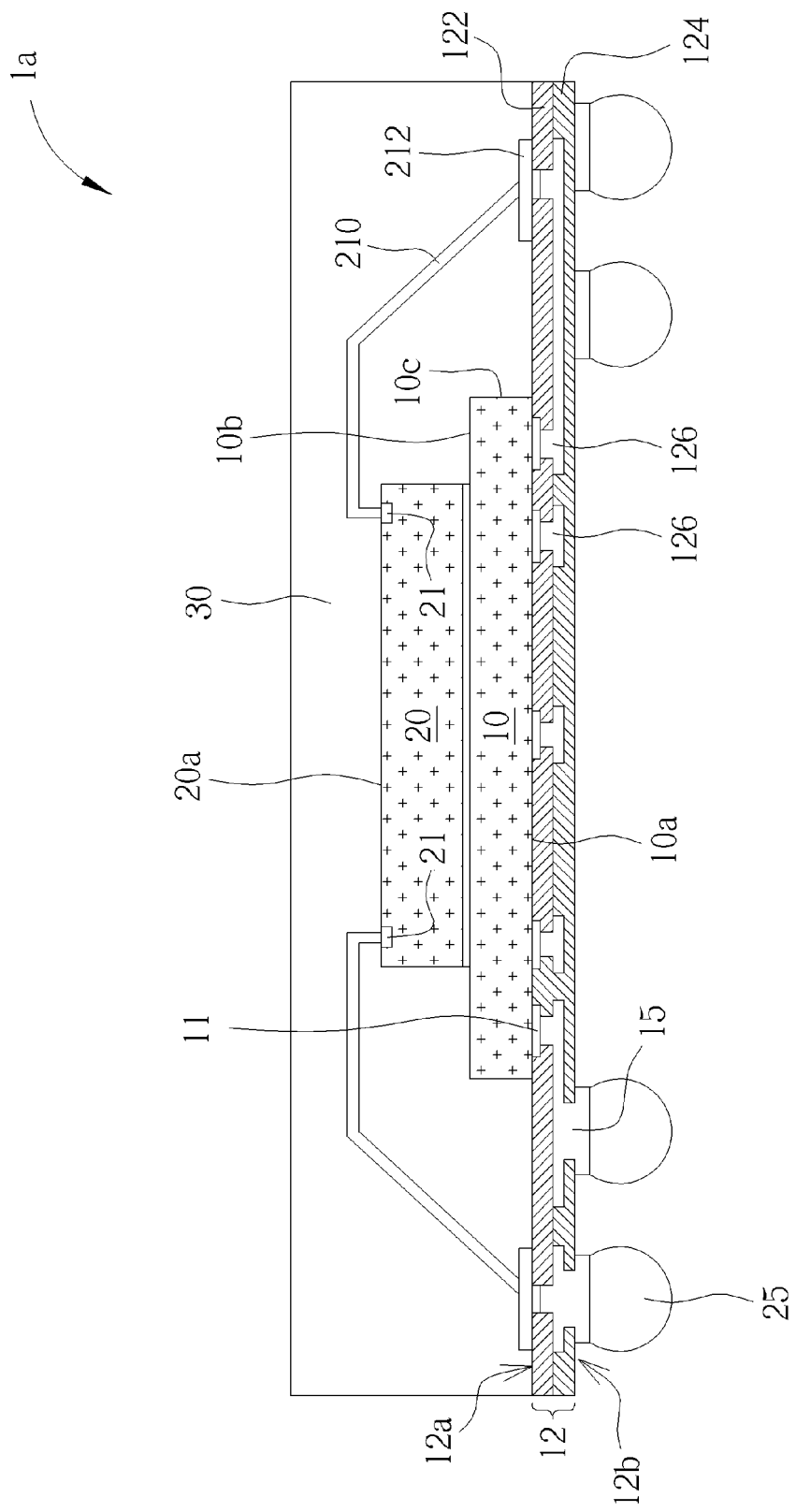
FIG. 3 is a schematic, cross-sectional diagram showing a hybrid system-in-package (SiP) according to one embodiment of this invention.

FIG. 3 is a schematic, cross-sectional diagram showing a hybrid system-in-package (SiP) according to one embodiment of this invention. As shown in FIG. 3, the hybrid SiP 1a comprises a first semiconductor die 10, a second semiconductor die 20 stacked directly on the first semiconductor die 10, and a mold cap 30 encapsulates the first semiconductor die 10 and the second semiconductor die 20. The first semiconductor die 10 has an active surface 10a, a bottom surface 10b that is opposite to the active surface 10a, and four sidewall surfaces 10c extending between the active surface 10a and the bottom surface 10b. A plurality of input/output (I/O) pads 11 may be provided on the active surface 10a. The second semiconductor die 20 has an active surface 20a and a plurality of I/O pads 21 provided on the active surface 20a.

According to the embodiment, the first semiconductor die 10 is a flipped die with its active surface 10a face-down such that the second semiconductor die 20 is stacked on the bottom surface 10b of the first semiconductor die 10. According to the embodiment, the second semiconductor die 20 may be mounted on the bottom surface 10b of the first semiconductor die 10 by using an adhesive layer or paste, but not limited thereto. According to the embodiment, the active surface 10a of the first semiconductor die 10 is flush with a surface of the mold cap 30.

According to the embodiment, a redistribution layer (RDL) structure (hereinafter referred to as "RDL structure") 12 is provided directly on the active surface 10a and on the surface of the mold cap 30 adjacent to the active surface 10a. The RDL structure 12 has a first side (or a "die side") 12a and a second side (or a "board side") 12b that is opposite to the first side 12a. The RDL structure 12 may comprise a passivation layer (or a planarization layer) 122 and at least a dielectric layer 124 laminated on the passivation layer 122. In another embodiment, the dielectric layer 124 may be formed on the passivation layer 122 by spin coating solution or by lamination. According to the embodiment, the passivation layer 122 is formed directly on the active surface 10a and on the surface of the mold cap 30 adjacent to the active surface 10a. Optionally, a solder mask (not shown) may be formed on the dielectric layer 124.

The RDL structure 12 may further comprise a re-routed metal layer 126 in the passivation layer 122 and the dielectric layer 124. The re-routed metal layer 126 may redistribute the I/O pads 11 on the active surface 10a of the first semiconductor die 10 to form fan-out pads 15 on the dielectric layer 124. According to the embodiment, the re-routed metal layer 126 may be formed by conventional semiconductor processes including, but not limited to, plating, lithographic processes, etching, and/or polishing.

For example, the passivation layer 122 may comprise silicon oxide, silicon nitride, silicon oxy-nitride, polyimide, or the like. The dielectric layer 124 may comprise silicon oxide, silicon nitride, silicon oxy-nitride, low-k materials, polyimide or the like. The re-routed metal layer 126 may comprise copper, aluminum, or copper-aluminum alloys, but is not limited thereto.

On the first side 12a of the RDL structure 12, a plurality of conductive fingers 212 are disposed around the first semiconductor die 10 and the second semiconductor die 20. According to the embodiment, the conductive fingers 212 may be copper fingers capped with Ni, Au, Ni/Pd/Au, Ag, or pre-plated finish (PPF), but is not limited thereto. The conductive fingers 212 are disposed on a surface of the passivation layer 122 and are embedded within the mold cap 30. A plurality of bond wires 210 extending between bond pads 21 on the active surface 20a and the respective conductive fingers 212. According to the embodiment, the second semiconductor die 20 may communicate with the first semiconductor die 10 through the bond wires 210, the conductive fingers 212, and the RDL structure 12.

On the second side 12b of the RDL structure 12, a plurality of conductive elements 25 are arranged on the respective fan-out pads 15 for further connection. The conductive elements 25 may comprise solder balls, BGA balls, copper pillars, or a combination thereof. For example, through the conductive elements 25, the hybrid SiP 1a may be electrically coupled to a printed circuit board (PCB), a substrate or an external device, but is not limited thereto.

Although only one wire-bonded die (i.e., the second semiconductor die 20) is shown in FIG. 3, it is to be understood that in other embodiments multiple wire-bonded dies may be stacked on the flipped die (i.e., the first semiconductor die 10) depending on the design requirements.

It is one technical feature of the invention that the wire-bonded die is integrated into a Fan-Out Wafer-Level-Package (FOWLP) by stacking directly on the flip chip of the FOWLP, thereby forming a hybrid SiP having three-dimensional (3D) configuration. It is another technical feature of the invention that such hybrid SiP does not use an expensive package substrate. Instead, a RDL structure is used, which is capable of providing finer pitch trace routing and smaller form factor, as well as the benefit of lower cost.

Figure 4:
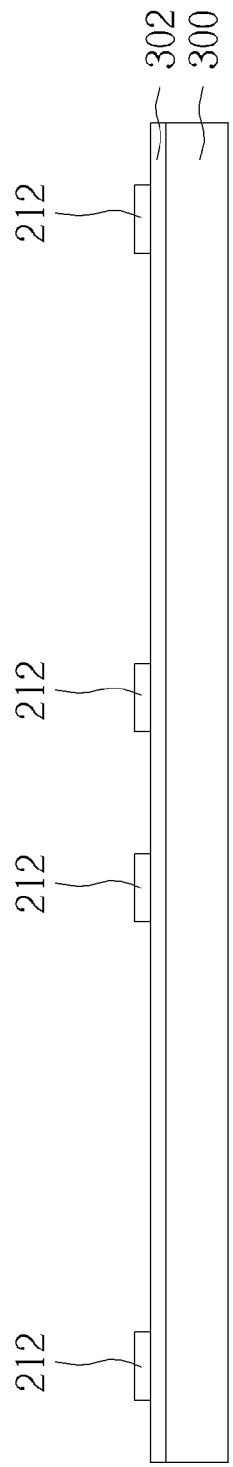

FIG. 4 to FIG. 10 are schematic, cross-sectional diagrams showing an exemplary method for fabricating a hybrid SiP as set forth in FIG. 3 according to one embodiment of the invention. As shown in FIG. 4, a carrier 300 is provided. The carrier 300 may be a wafer comprising plastic, ceramic, glass, silicon, or the like. It is understood that other suitable materials for the carrier 300 may be employed. An adhesive layer 302 may be formed on a major surface of the carrier 300.

A plurality of conductive fingers 212 is then formed on the adhesive layer 302. For example, a seed layer (not shown) may be deposited on the top surface of the adhesive layer 302 in a blanked manner. A patterned mask such as a photoresist (not shown) may be formed on the seed layer. A plating process may be performed to deposit metals such as copper and then Ni/Au in areas not covered by the patterned mask. Subsequently, the patterned mask is removed. Finally, the exposed seed layer is removed. It is understood that other methods for forming the conductive fingers 212 may be employed.

Figure 5:
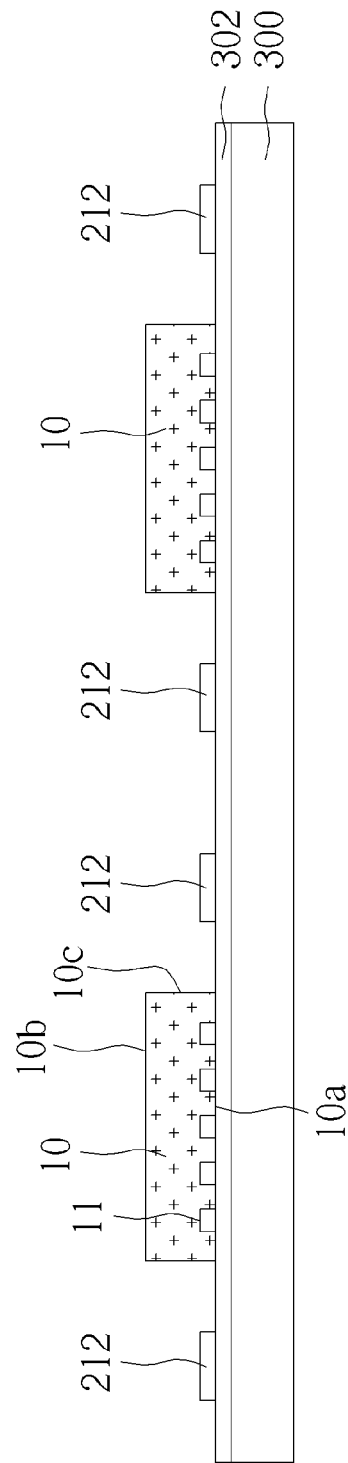

As shown in FIG. 5, a plurality of first semiconductor dies 10 are mounted on the adhesive layer 302 within respective chip mounting areas. It is understood that in some embodiments the adhesive layer 302 may be omitted. The dies may be adhered to the carrier 300 with glue or the like. Each of the first semiconductor dies 10 has an active surface 10a, a bottom surface 10b that is opposite to the active surface 10a, and four sidewall surfaces 10c extending between the active surface 10a and the bottom surface 10b. A plurality of input/output (I/O) pads 11 may be provided on the active surface 10a. The first semiconductor dies 10 are flipped dies with their active surfaces 10a facing toward and in direct contact with the adhesive layer 302.

Figure 6:
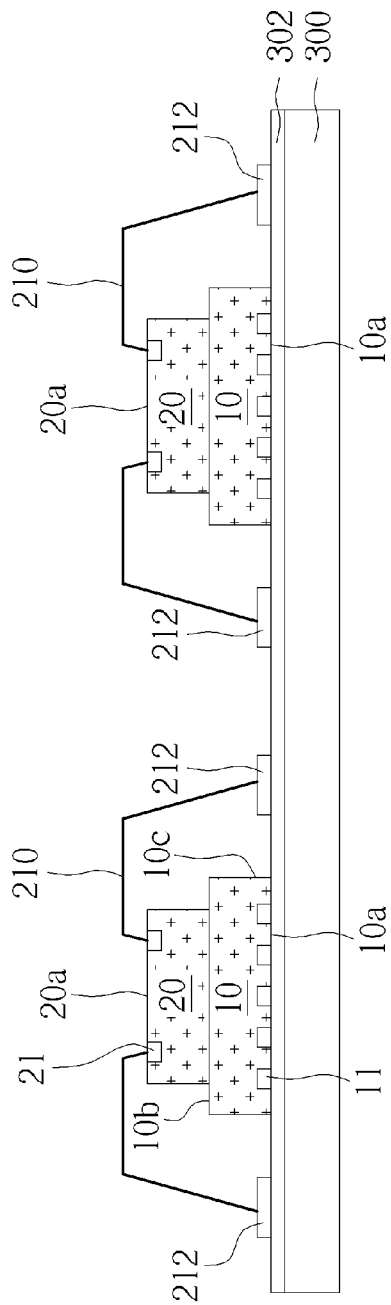

As shown in FIG. 6, a plurality of second semiconductor dies are directly mounted on the first semiconductor dies 10 respectively. According to the embodiment, each of the second semiconductor dies 20 may be mounted on the bottom surface 10 of each of the first semiconductor dies 10 by using an adhesive layer or paste, but not limited thereto.

A wire bonding process is then performed to form a plurality of bond wires 210 extending between bond pads 21 on the active surface 20a of each of the second semiconductor dies 20 and the respective conductive fingers 212. By performing the wire bonding process at this stage, damage caused by the stress of a wire bonder is avoided.

Figure 7:
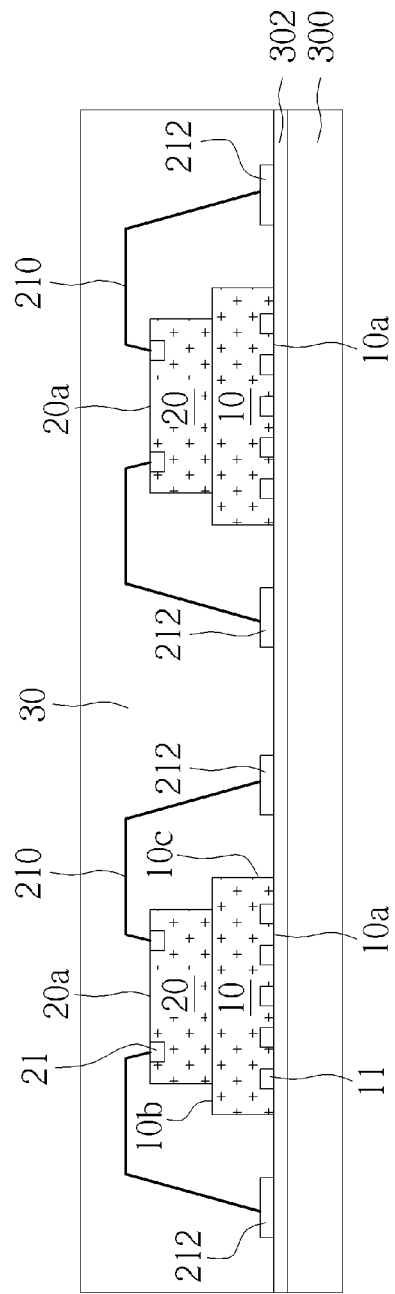

As shown in FIG. 7, after the wire bonding process, a wafer molding process is carried out to form a mold cap 30 encapsulating the first semiconductor dies 10, the second semiconductor dies 20 and the bond wires 210. The mold cap 30 also covers the exposed surface of the adhesive layer 302. The mold cap 30 may comprise a mixture of epoxy and silica fillers, but is not limited thereto. The mold cap 30 may be subjected to a curing process.

As shown in FIG. 8, subsequently, the carrier 300 and the adhesive layer 302 are removed. The de-bonding of the carrier 300 may be performed by using a laser process, UV irradiation process, grinding process, or etching process, but is not limited thereto. After removing the carrier 300 and the adhesive layer 302, a bottom surface of each of the conductive fingers 212 is exposed from a bottom surface of the mold cap 30. The active surfaces 10a of the first semiconductor dies 10 are flush with the bottom surface 30a of the mold cap 30.

As shown in FIG. 9, a redistribution layer (RDL) structure (or RDL structure) 12 is then fabricated on the active surfaces 10a of the first semiconductor dies 10 and the bottom surface 30a of the mold cap 30. The RDL structure 12 may comprise a passivation layer (or a planarization layer) 122 and at least a dielectric layer 124 laminated on the passivation layer 122. In some embodiment, the dielectric layer 124 may be omitted. According to the embodiment, the passivation layer 122 is formed directly on the active surface 10a and on the bottom surface 30a of the mold cap 30. Optionally, a solder mask (not shown) may be formed on the dielectric layer 124.

The RDL structure 12 may further comprise a re-routed metal layer 126 in the passivation layer 122 and the dielectric layer 124. The re-routed metal layer 126 may redistribute the I/O pads 11 on the active surface 10a of the first semiconductor die 10 to form fan-out pads 15 on the dielectric layer 124.

According to the embodiment, the re-routed metal layer 126 may be formed by conventional semiconductor processes including, but not limited to, plating, lithographic processes, etching, and/or polishing.

For example, the passivation layer 122 may comprise silicon oxide, silicon nitride, silicon oxy-nitride, polyimide, or the like. The dielectric layer 124 may comprise silicon oxide, silicon nitride, silicon oxy-nitride, low-k materials, polyimide or the like. The re-routed metal layer 126 may comprise copper, aluminum, or copper-aluminum alloys, but is not limited thereto.

Subsequently, a plurality of solder balls (or BGA balls) 25 are arranged on the respective fan-out pads 15 for further connection. At this point, a wafer-level system-in-package is formed.

Figure 10:
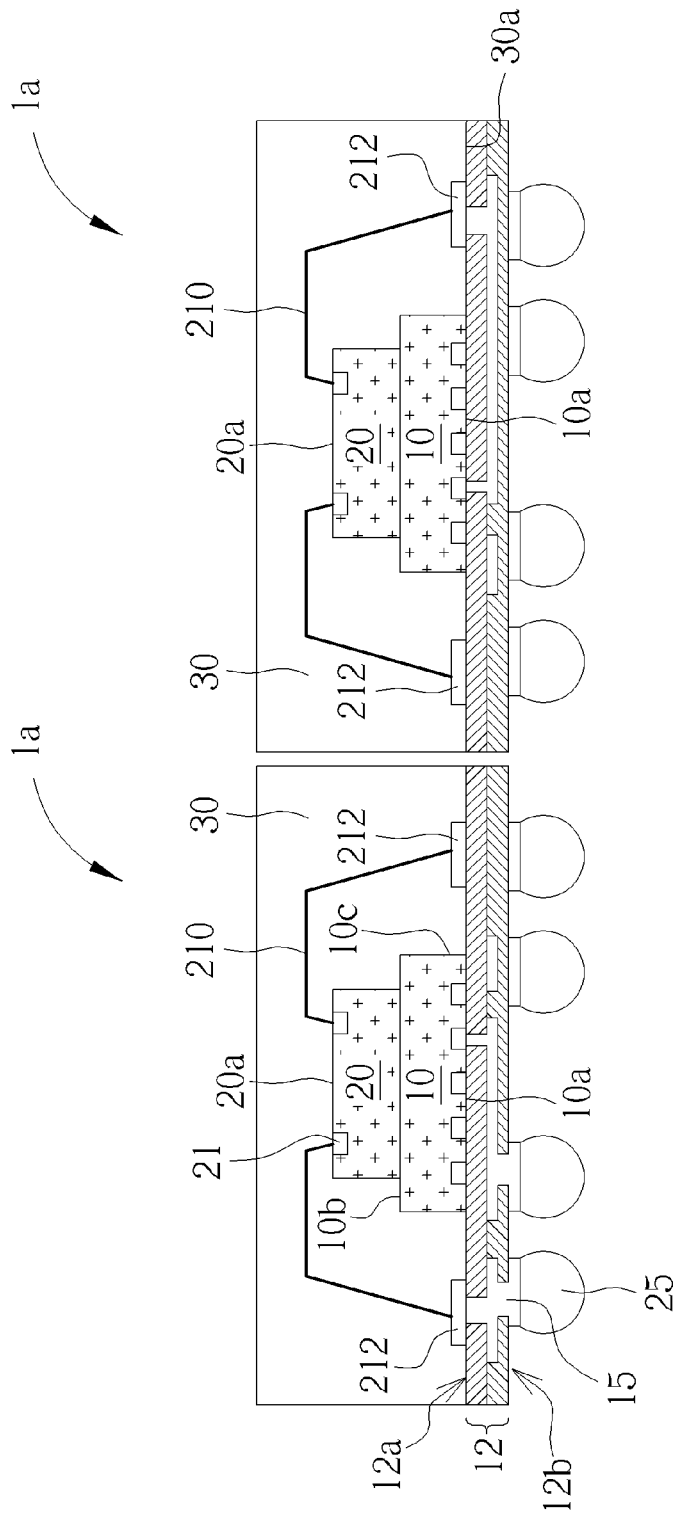

As shown in FIG. 10, a wafer dicing process is carried out. The wafer-level system-in-package is diced along the scribe lines and singulated into individual hybrid system-in-packages (hybrid SiPs) 1a.

Figure 11:
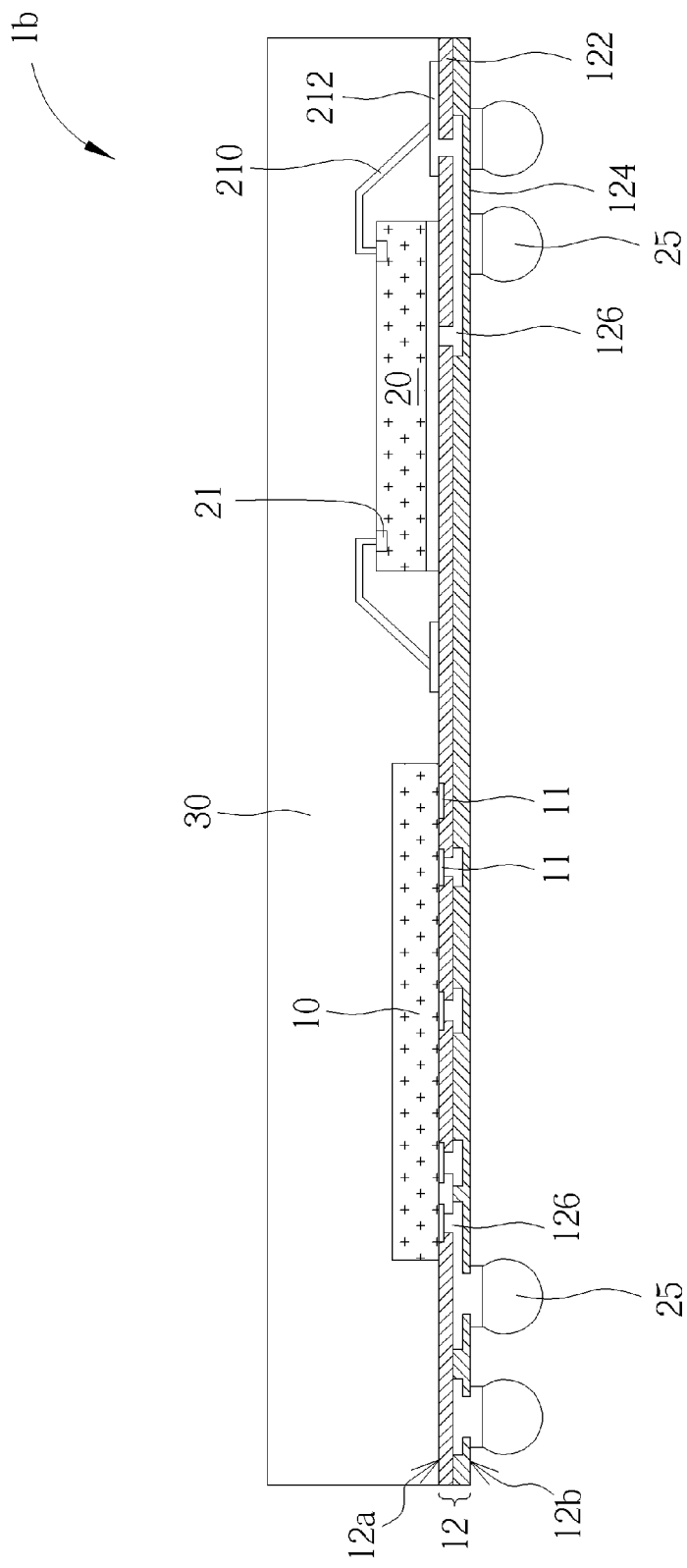
FIG. 11 is a schematic, cross-sectional diagram showing a hybrid SiP according to another embodiment of this invention.

FIG. 11 is a schematic, cross-sectional diagram showing a hybrid SiP according to another embodiment of this invention, wherein like numeral numbers designate like regions, elements, and layers. As shown in FIG. 11, in some circumstances that the thickness of the hybrid system-in-package is critical and is required to be reduced, the second semiconductor die 20 may be disposed directly on the first side 12a of the RDL structure 12 instead of directly stacking on the first semiconductor die 10. According to this embodiment, the hybrid SiP 1b comprises the first semiconductor die 10 and the second semiconductor die 20 arranged side by side on the first side 12a of the RDL structure 12. The conductive fingers 212 are disposed around the second semiconductor die 20. Bond wires 210 electrically connect the second semiconductor die 20 to the plurality of conductive fingers 212. A mold cap 30 encapsulates the first semiconductor die 10, the conductive fingers 212, the second semiconductor die 20, and the first side 12a of the RDL structure 12.

Figure 12:
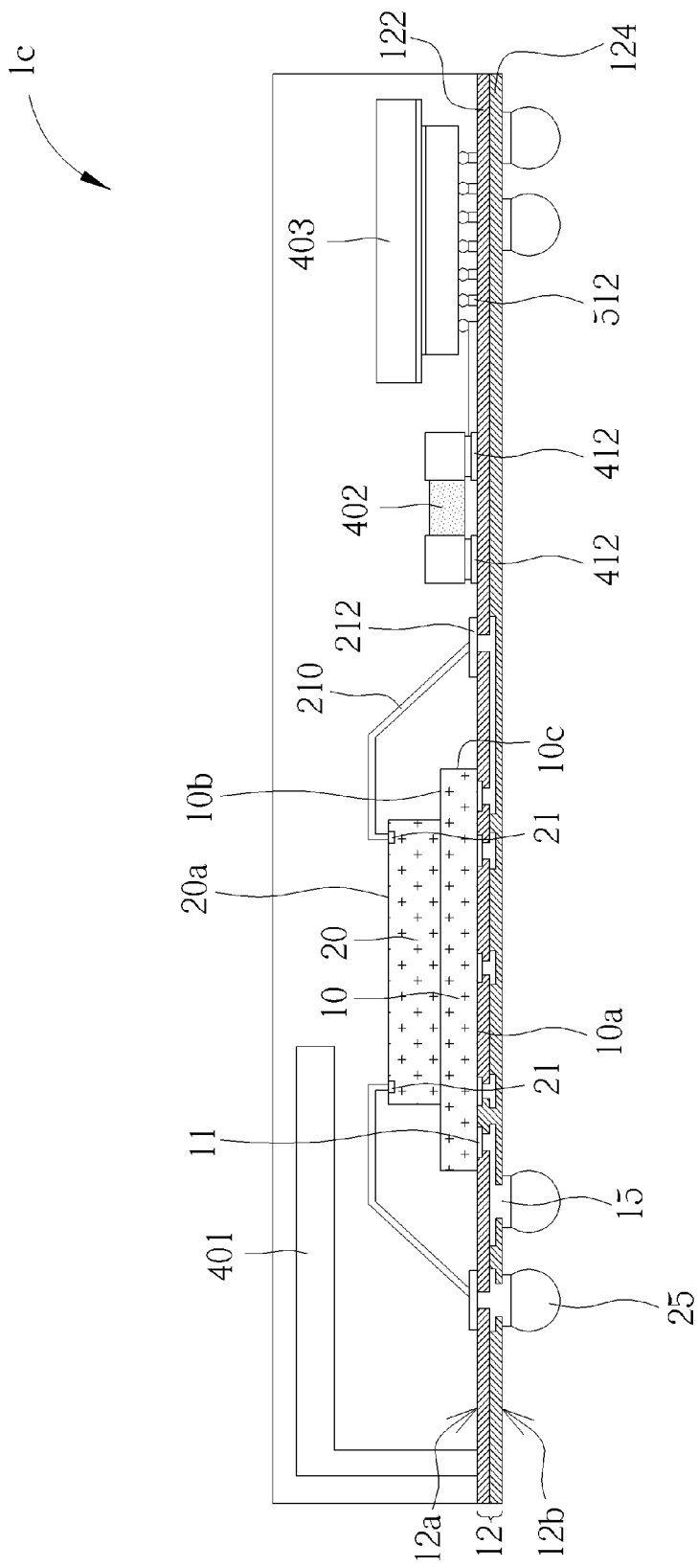
FIG. 12 illustrates a plurality of additional components mounted on the first side of the RDL structure and molded together with the first and second semiconductor dies according to other embodiments.

FIG. 12 is a schematic, cross-sectional diagram showing a hybrid SiP according to yet another embodiment of this invention, wherein like numeral numbers designate like regions, elements, and layers. In addition to the first semiconductor die 10 and second semiconductor die 20 as set forth in FIG. 3, a plurality of circuit elements or components with different functions may be mounted on the first side 12a of the RDL structure 12 and molded together with the first semiconductor die 10 and second semiconductor die 20. For example, in FIG. 12, circuit elements or components such as an antenna 401, a passive component 402, and/or a Ferrite plate 403 may be mounted on the first side 12a of the RDL structure 12. According to the illustrated embodiment, the electrodes of the passive component 402 may be mounted on the bond pads 412. The passive component 402 may comprise a resistor or a capacitor, but is not limited thereto. According to the illustrated embodiment, the connection points of the Ferrite plate 403 may be mounted on the bond pads 512. In another embodiment, a FCBGA package may be mounted on the hybrid SiP 1c, the FCBGA package comprises a die mounted face-down on the first side 12a of the RDL structure 12.

Figure 13:
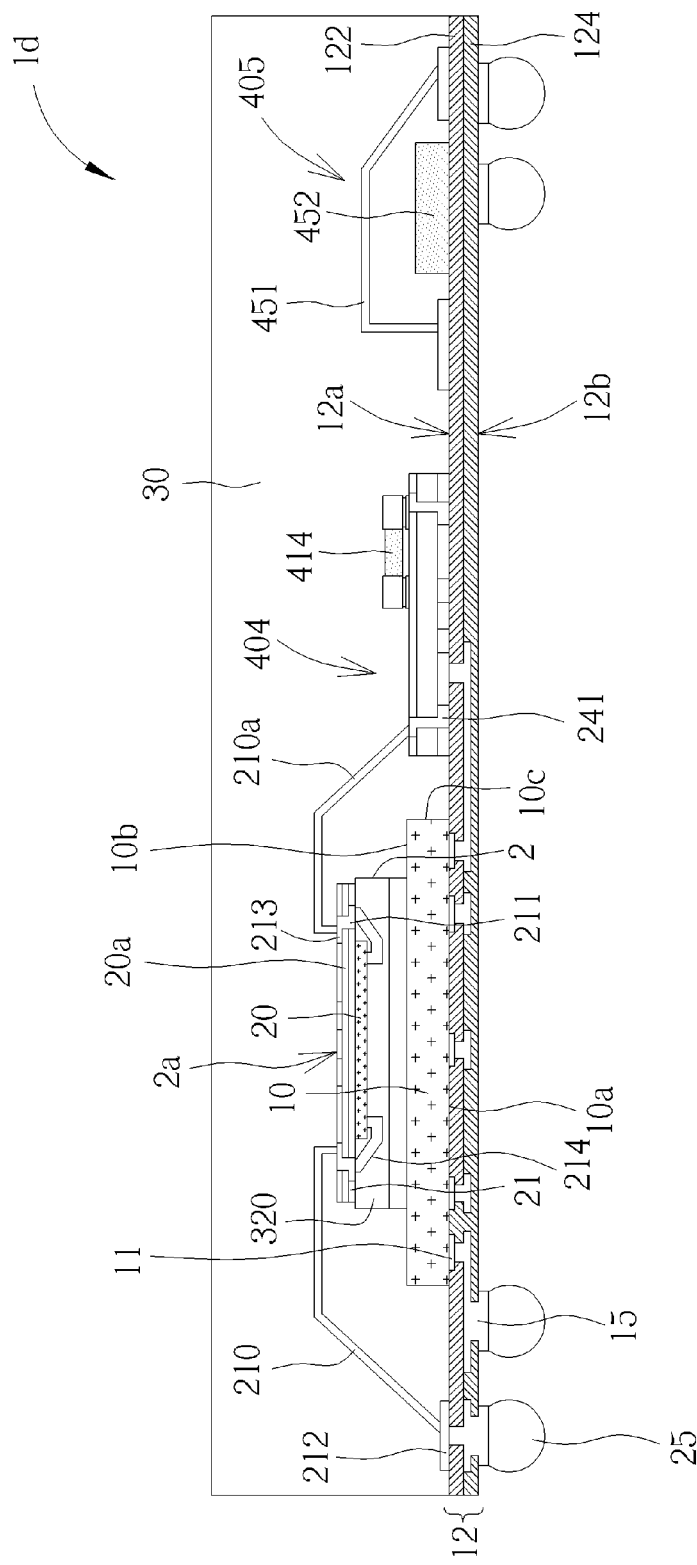
FIG. 13 is a schematic, cross-sectional diagram showing a hybrid SiP according to still another embodiment of this invention, wherein a wire-bonded chip package is mounted on the first semiconductor die in the hybrid SiP.

FIG. 13 is a schematic, cross-sectional diagram showing a hybrid SiP according to still another embodiment of this invention, wherein like numeral numbers designate like regions, elements, and layers. As shown in FIG. 13, the hybrid SiP 1d comprises a first semiconductor die 10, a chip package 2 stacked directly on the first semiconductor die 10 in a back-to-back manner, and a mold cap 30 encapsulates the first semiconductor die 10 and the chip package 2. According to the illustrated embodiment, the chip package 2 comprises a second semiconductor die 20 encapsulated by a molding compound 320. The second semiconductor die 20 may be mounted on a top surface of a packaging substrate 21 and the second semiconductor die 20 may be electrically connected to the bond pads 211 of the packaging substrate 21 through a plurality of wire bonds 214.

The chip package 2 comprises a wire bonding surface 2a that is a bottom surface of the packaging substrate 21. A plurality of bond pads 213 is arranged on the wire bonding surface 2a. Some of the bond pads 213 are electrically connected to the conductive fingers 212 through bond wires 210. Some of the bond pads 213 are electrically connected to a bond pad 241 on a substrate interposer 404 mounted on the first side 12a of the RDL structure 12. Optionally, a circuit component 414 such as a passive component may be mounted on the substrate interposer 404.

Further, according to the illustrated embodiment, a wire-bonding inductor 405 may be formed on the first side 12a of the RDL structure 12 and is also molded in the mold cap 30. The wire-bonding inductor 405 may comprise a plurality of bond wires 451 coupled to a plurality of traces (not explicitly shown) in the RDL structure 12, which form windings of the inductor 405 to surround a core 452 of the inductor 405. The core 452 may be composed of specific material with different conductor permeability.

Figure 14:
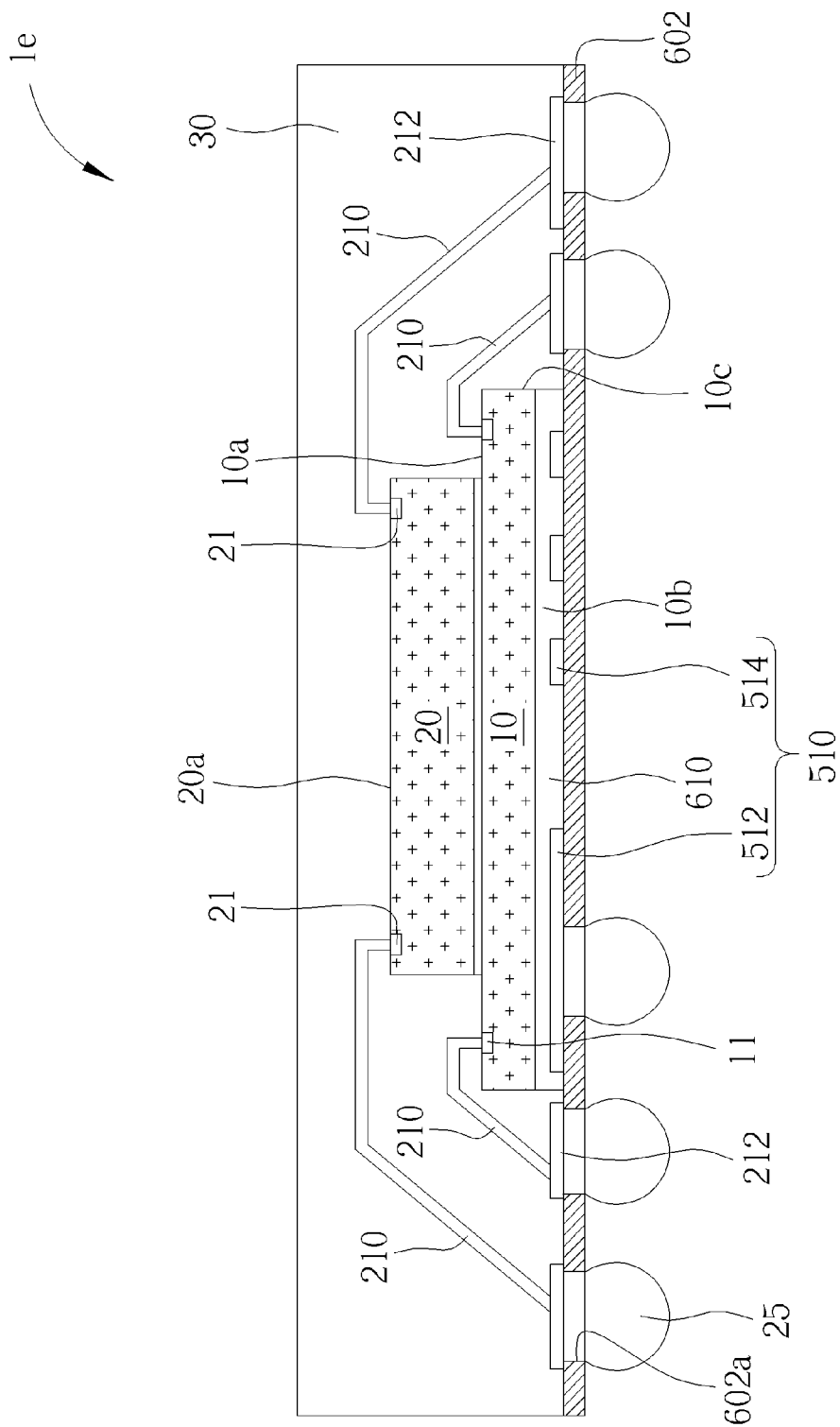
FIG. 14 to FIG. 16 are schematic, cross-sectional diagrams showing various embodiments of this invention.
Figure 15:
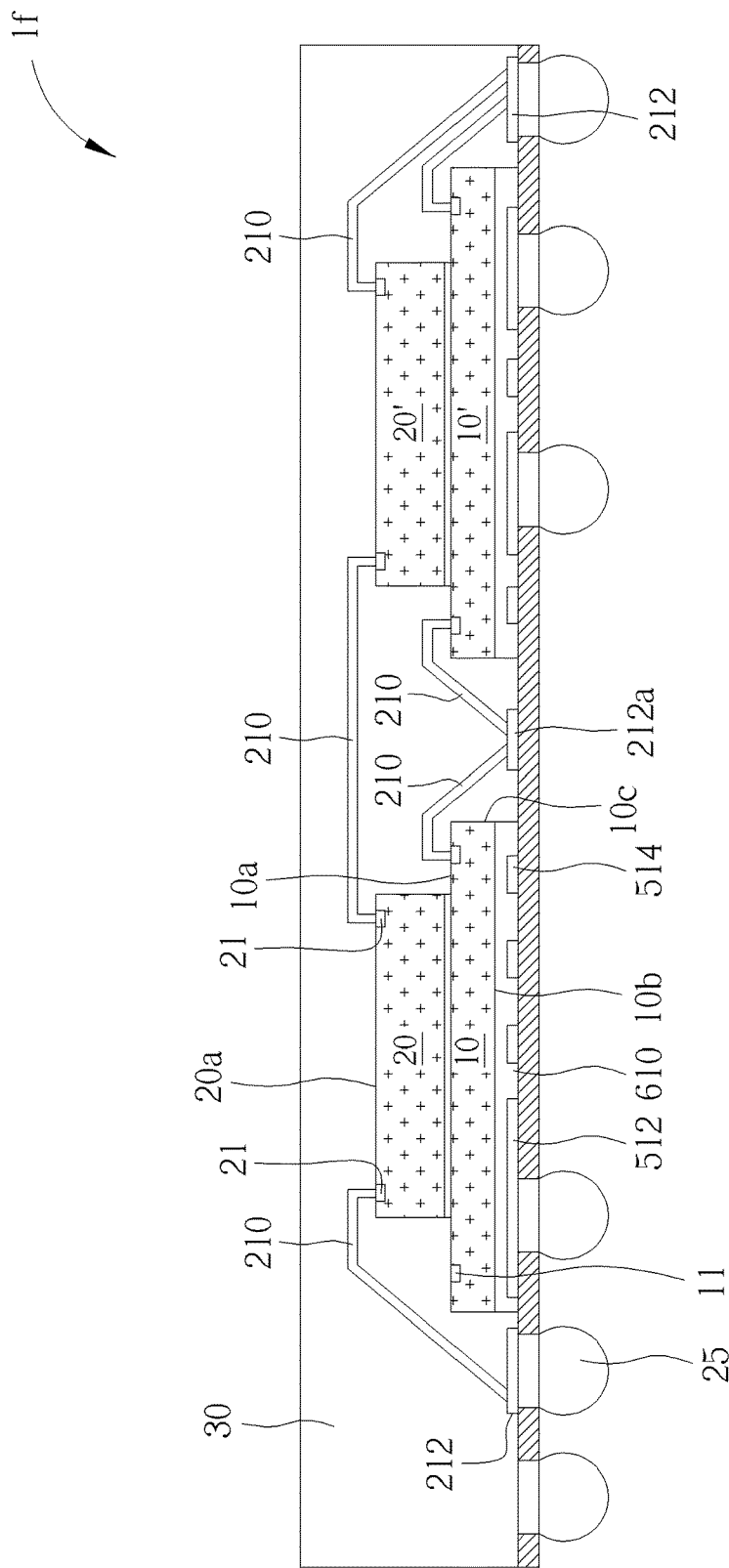
Figure 16:
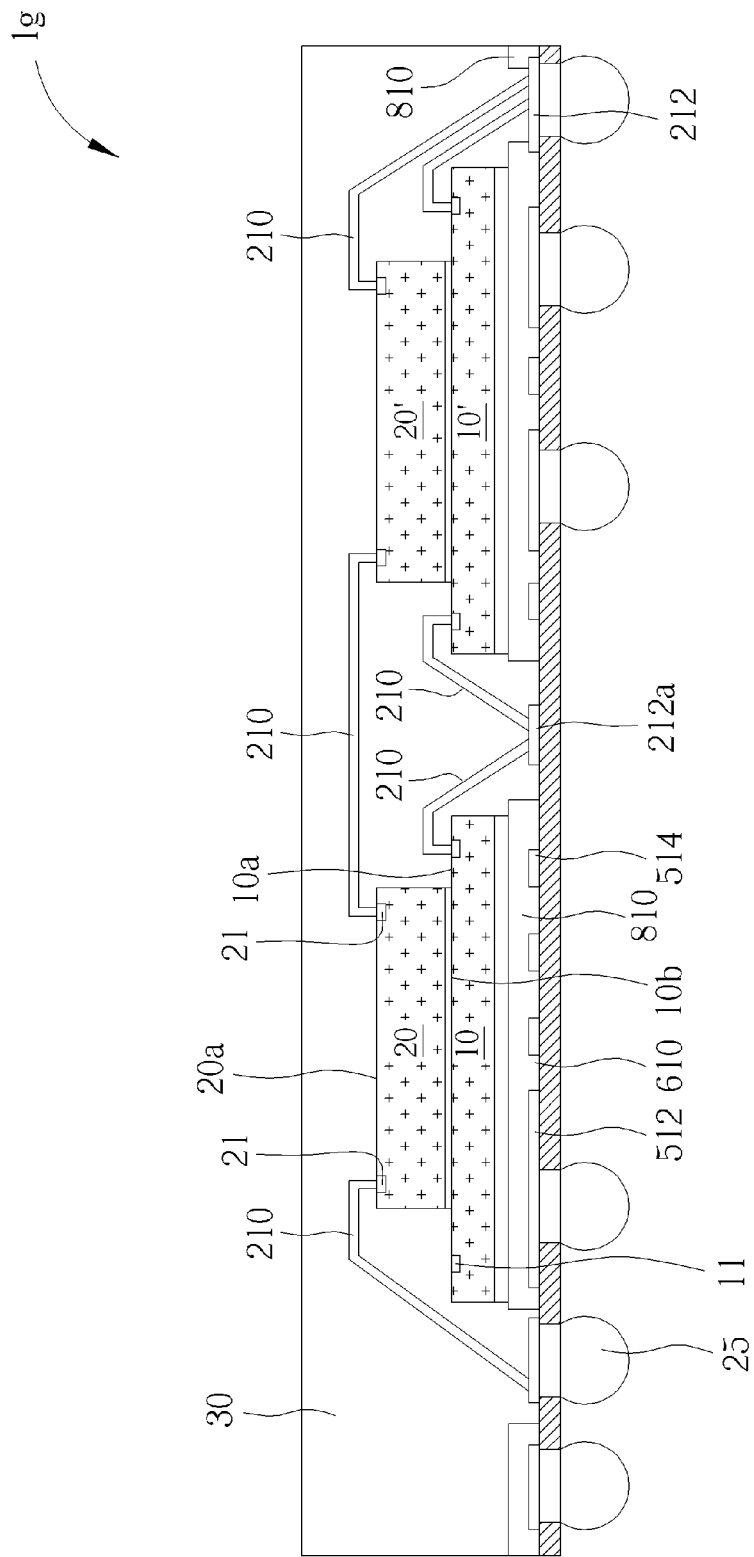

FIG. 14 to FIG. 16 are schematic, cross-sectional diagrams showing various embodiments of this invention, wherein like numeral numbers designate like regions, elements, and layers.

As shown in FIG. 14, the SiP 1e comprises a first semiconductor die 10, a second semiconductor die 20 stacked directly on the first semiconductor die 10, and a mold cap 30 encapsulates the first semiconductor die 10 and the second semiconductor die 20. The first semiconductor die 10 has an active surface 10a, a bottom surface 10b that is opposite to the active surface 10a, and four sidewall surfaces 10c extending between the active surface 10a and the bottom surface 10b. A plurality of input/output (I/O) pads 11 may be provided on the active surface 10a. The second semiconductor die 20 has an active surface 20a and a plurality of I/O pads 21 provided on the active surface 20a.

According to the embodiment, the first semiconductor die 10 and the second semiconductor die 20 are both wire-bonding dies. The active surface 10a of the first semiconductor die 10 faces upward and the second semiconductor die 20 is directly stacked on the active surface 10a of the first semiconductor die 10. The second semiconductor die 20 may be mounted onto the first semiconductor die 10 by using an adhesive layer or paste, but not limited thereto.

A plurality of conductive fingers 212 is disposed around the first semiconductor die 10. According to the embodiment, the conductive fingers 212 may be copper fingers capped with Ni/Au, but is not limited thereto. A plurality of bond wires 210 extending between bond pads 21 on the active surface 20a and the respective conductive fingers 212 and between bond pads 11 on the active surface 10a and the respective conductive fingers 212.

The SiP 1e further comprises circuit features 510 including, but not limited to, at least a pad feature 512 and fine traces 514. The circuit features 510 are coplanar with the conductive fingers 212. Like the conductive fingers 212, the circuit features 510 are also embedded in the mold cap 30.

The bottom surface of the mold cap 30, the bottom surfaces of the conductive fingers 212 and the circuit features 510 are covered with a dielectric layer 602 such as a polyimide or a solder mask.

According to the embodiment, the circuit features 510 may be embedded in the adhesive layer 610 between the first semiconductor die 10 and the dielectric layer 602. Solder openings 602a may be formed in the dielectric layer 602 to expose respective bottom surfaces of the conductive fingers 212 and the pad feature 512. Conductive elements 25 are arranged on the exposed bottom surfaces of the conductive fingers 212 and the pad feature 512 for further connection.

One advantage of this embodiment is that the SiP 1e in FIG. 14 involves one-metal-one-dielectric scheme that uses only one metal layer to form coplanar conductive fingers 212 and circuit features 510 and only one dielectric layer 602 covering the conductive fingers 212 and circuit features 510, thereby forming a thinner package profile. The cost of this package is reduced because the RDL structure as set forth in FIG. 3 is omitted. Fine traces 514 with reduced routing width or space can be achieved because a thinner copper post-passivation-interconnect (Cu PPI) is used.

FIG. 15 illustrates a SiP if that also employs the aforesaid one-metal-one-dielectric scheme as described in FIG. 14. The difference between the SiP if in FIG. 15 and the SiP 1e in FIG. 14 is that the SiP if includes more die stacks (or chip stacks) in one package. As shown in FIG. 15, the additional die stack including a third semiconductor die 10' and a fourth semiconductor die 20' mounted on the third semiconductor die 10' is disposed in proximity to the die stack including the first semiconductor die 10 and the second semiconductor die 20. The third semiconductor die 10' and the first semiconductor die 10 may be wire bonded to a common conductive finger 212a. Therefore, the third semiconductor die 10' may be electrically connected to the first semiconductor die 10 through the bond wire 210 and the common conductive finger 212a. Also, the dies may be electrically connected together directly through the bond wires. For example, the second semiconductor die 20 may be electrically connected to the fourth semiconductor die 20' through the bond wire 210.

FIG. 16 illustrates a SiP 1g that employs one-metal-two-dielectric scheme. As shown in FIG. 16, the difference between the SiP 1g in FIG. 16 and the SiP 1f in FIG. 15 is that the SiP 1g comprises a dielectric layer 810 covering at least some of the conductive fingers 212 and at least some of the circuit features 510. For example, the dielectric layer 810 may comprise polyimide or solder mask, but is not limited thereto. According to the illustrative embodiment, the third semiconductor die 10' and the first semiconductor die 10 may be mounted on the dielectric layer 810.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A system-in-package (SiP), comprising:
a first dielectric layer;
a first semiconductor die mounted on the first dielectric layer through an adhesive layer;
a plurality of conductive fingers on the first dielectric layer around the first semiconductor die;
a plurality of circuit features on the first dielectric layer, wherein at least some of the circuit features are disposed directly under the first semiconductor die, wherein said at least some of the circuit features disposed directly under the first semiconductor die are covered by the adhesive layer and are not in direct contact with the first semiconductor die;
a second semiconductor die stacked directly on the first semiconductor die;
a plurality of first bond wires extending between the first semiconductor die and some of the conductive fingers and between the second semiconductor die and some of the conductive fingers;
a mold cap encapsulating the first semiconductor die, the conductive fingers, the second semiconductor die, the plurality of first bond wires, and covering a surface of the first dielectric layer;
a third semiconductor die mounted on the first dielectric layer; and
a fourth semiconductor die mounted on the third semiconductor die,
wherein the fourth semiconductor die is electrically connected to the second semiconductor die through a second bond wire.

2. The SiP according to claim 1, wherein the circuit features and the conductive fingers are disposed on a same side of the first dielectric layer.

3. The SiP according to claim 2, wherein the circuit features and the conductive fingers are coplanar.

4. The SiP according to claim 1, further comprising a second dielectric layer covering at least some of the conductive fingers and some of the circuit features.

5. The SiP according to claim 4, wherein the second dielectric layer comprises polyimide or solder mask.

6. The SiP according to claim 5, wherein the first dielectric layer comprises polyimide or solder mask.

7. The SiP according to claim 1, wherein the circuit features comprise at least one pad feature and fine traces.

8. The SiP according to claim 7, further comprising a plurality of conductive elements disposed in openings in the first dielectric layer and on the pad feature and respective said conductive fingers.

9. The SiP according to claim 1, wherein the conductive fingers are copper fingers capped with Ni, Au, Ni/Pd/Au, Ag, or pre-plated finish (PPF).

10. The SiP according to claim 1 further comprising a circuit component selected from a group comprised of an antenna, a passive component, a Ferrite plate, a substrate interposer, and a wire-bonding inductor.

11. The SiP according to claim 1 further comprising a common conductive finger on the first dielectric layer between the first semiconductor die and the third semiconductor die.

12. The SiP according to claim 11, wherein the first semiconductor die and the third semiconductor die are wire bonded to the common conductive finger.

* * * * *